(12) United States Patent
Benmouyal

(10) Patent No.: US 6,934,654 B2
(45) Date of Patent: Aug. 23, 2005

(54) SYSTEM AND METHOD FOR EXACT COMPENSATION OF FUNDAMENTAL PHASORS

(75) Inventor: Gabriel Benmouyal, Boucherville (CA)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 34 days.

(21) Appl. No.: 10/393,831

(22) Filed: Mar. 21, 2003

(65) Prior Publication Data

US 2004/0186669 A1 Sep. 23, 2004

(51) Int. Cl.[7] .............................................. G01R 35/00
(52) U.S. Cl. ....................................... 702/106; 375/226
(58) Field of Search ............................... 702/58–60, 64, 702/65, 72, 75, 77, 86, 90, 147, 183, 184, 196, 197, 106; 361/62, 64, 66, 76, 78, 79, 85, 88, 93.1; 324/545, 772; 375/226

(56) References Cited

U.S. PATENT DOCUMENTS

| | | | | |
|---|---|---|---|---|
| 5,805,395 A | * | 9/1998 | Hu et al. | 361/21 |
| 5,809,045 A | * | 9/1998 | Adamiak et al. | 714/799 |
| 6,141,196 A | * | 10/2000 | Premerlani et al. | 361/78 |
| 6,148,267 A | * | 11/2000 | Premerlani | 702/58 |

* cited by examiner

Primary Examiner—Marc S. Hoff
Assistant Examiner—Mohamed Charioui
(74) Attorney, Agent, or Firm—Cook, Alex, McFarron, Manzo, Cummings & Mehler, Ltd.

(57) ABSTRACT

A measured phasor representing a sinusoidal power signal waveform is produced by orthogonal FIR filters, one of which produces the real part of the phasor and the other of which produces the imaginary part. The frequency difference between the rated frequency of the signal waveform in the power system and the actual frequency of the waveform at any selected point in time is determined and the elements (A, B, C, D) of a compensation matrix is determined. The compensation matrix is then used to perform a linear transformation to produce an exact phasor for the waveform.

19 Claims, 6 Drawing Sheets

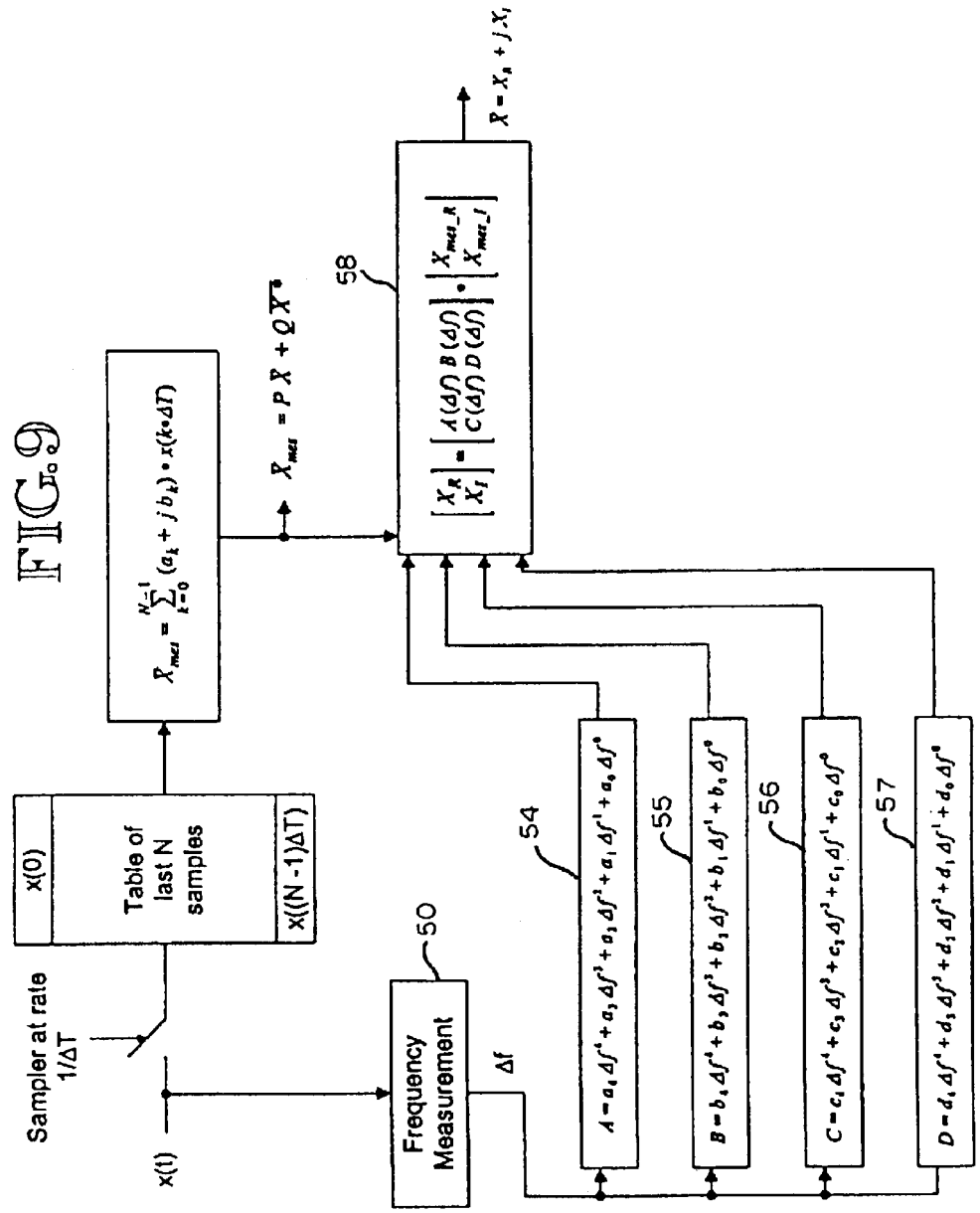

US 6,934,654 B2

SYSTEM AND METHOD FOR EXACT COMPENSATION OF FUNDAMENTAL PHASORS

TECHNICAL FIELD

This invention relates generally to the computation of phasors corresponding to voltage and current waveforms in an electric power system, which are used for instance as inputs to digital protective relays for the power system, and more specifically concerns a system and method for compensating such computated phasors when the actual power system signal frequency is different than its rated frequency, which would otherwise result in errors in the phasors.

BACKGROUND OF THE INVENTION

In microprocessor-based protective relays, such as used for protection of electric power systems, a pair of numerical filters is typically used to compute the complex numbers which represent the fundamental component phasors for the power system voltage and current waveforms. The phasors are used by the protective relay to carry out its monitoring and protection functions for the power system. The numerical filters are designed so that their output waveforms are orthogonal, which reduces the impact of waveform harmonics and DC offsets. Typically, digital finite impulse response (FIR) filters are used in this arrangement. One FIR filter output represents the real part of the complex number for the phasor, while the output of the other FIR filter represents the imaginary part of the complex number.

The filters are designed such that at the rated frequency of the power system, i.e. 60 or 50 Hz, depending on the particular country, the gain of each filter is unity and the phase angle between the two outputs is 90°, i.e. orthogonal. However, when the actual power system frequency is different than the rated frequency, the phasor (produced by the two filters) will have errors, both in magnitude and in phase angle; these errors become larger as the actual power signal frequency deviates further from the rated frequency. Errors in the phasors are undesirable, as they can result in erroneous/poor performance of the protective relay.

Although various techniques are known and have been used to compensate for fundamental component phasor errors resulting from differences between the actual frequency and the rated frequency, one well-known and frequently used technique, known generally as frequency tracking, adjusts the number of samples per cycle (the sampling frequency) for the incoming power signal depending on line difference between the actual and rated frequencies. The frequency of the incoming power signal (the actual power system frequency) is measured and the sampling frequency is adjusted accordingly.

Another technique, based on a fixed sampling rate, is described in U.S. Pat. No. 6,141,196 to Premerlani, which corrects the phasor obtained from the filtering system by introducing two correction factors, referred to in Premerlani as $\epsilon_1$ and $\epsilon_2$. The correction factors are used in the following equation, where $Z_m$ is equal to the corrected phasor and $X_m$ is the measured (actual) phasor.

$$\overline{Z}_m = (1+\epsilon_2-\epsilon_1)\overline{X}_m$$

The Premerlani $\epsilon_1$ and $\epsilon_2$ values are calculated using specific equations set out in Premerlani, which include values of actual (measured) system frequency and rated frequency. However, the Premerlani technique, while providing some correction for phasor errors due to frequency difference, still results in phasors which include some error. The amount of the error increases as the frequency difference increases. Further, the Premerlani technique is applicable only to full cycle Fourier-type FIR filters. It cannot be used for other FIR filters, such as Cosine filters.

Hence, it would be desirable to have a compensation system which provides an exact compensation for phasors when the measured power system frequency is different from the rated frequency, and further that such a compensation system provide such exact compensation over a wide range of frequency difference.

SUMMARY OF THE INVENTION

Accordingly, the present invention is a system and corresponding method for determining an accurate fundamental phasor for a signal waveform from a system, such as a power signal waveform from a power system, where there is a difference between a rated frequency of such waveform for said system and an actual frequency of the waveform at a given point in time, comprising: a circuit for determining a measured phasor, including both real and imaginary parts, representing the signal waveform, without adjusting for frequency of the waveform, wherein the measured phasor contains errors if the actual frequency of the waveform is different than the rated frequency; a circuit for determining the actual frequency of the waveform in the system and the frequency difference between the actual frequency and the rated frequency; and a circuit for determining an actual phasor, including both real and imaginary parts for said waveform, which takes into account said frequency difference, by multiplying the real and imaginary components of the measured phasor by a preselected 2 by 2 compensating matrix.

BRIEF DESCRIPTION OF THE DRAWINGS

FIG. 9 is a diagram showing the frequency compensation system of the present invention using polynomial regression for the four compensating matrix elements.

BEST MODE FOR CARRYING OUT THE INVENTION

As discussed briefly above, a pair of orthogonal filters, generally digital finite response (FIR) filters are used to produce the fundamental component phasors representing the voltage and current waveforms of a power system. These phasors are then used by digital protective relays to ascertain power system fault conditions and, when necessary, provide a tripping action. An FIR filter is a digital filter that has an impulse response which is zero outside some finite time interval. Digital filters which utilize this technique include Fourier and Cosine filters. The individual coefficients of the FIR filters are typically selected such that the gain of each filter is unity (1) at the rated frequency of the power system and such that the phase angle between the two outputs of the orthogonal filters is 90° at the rated frequency.

The system and method of the present invention is directed toward compensating the calculated phasors when the actual frequency of the power system varies from the rated frequency. Rated frequencies are typically either 60 Hz or 50 Hz, depending upon the country where the power system is located. A power system is designed to operate at its rated frequency. In some cases, however, there can be a substantial difference (as much as 10 Hz) between the rated power system frequency and the actual frequency, due to system conditions with severe disturbances.

The present invention uses a linear transformation of the Cartesian components of the calculated phasor to provide an exact frequency compensation. It is applicable to any filtering system which comprises two orthogonal FIR filters, including particularly Fourier and Cosine filters, but other FIR filters or combinations thereof as well. It thus has the advantage of wide applicability.

The output of one of the two orthogonal filters which are responsive to input voltage and/or current waveforms from the power system, referred to as the "cosine" part, is represented by the (a) coefficients of the system and provides the real part of the resulting calculated phasor, while the output of the other filter, referred to as the "sine" part, is represented by the (b) coefficients and provides the imaginary part of the calculated phasor. The combination of the outputs of the two filters is the fundamental measured phasor representing the voltage or current input waveform.

The two filters will have N coefficients, corresponding to the number of samples of the input waveform (voltage or current, for example) being processed within one data window. Typically, N will be 12, 16, 24 or 32.

Generally, the measured phasor for the voltage/current input waveforms is computed using the following formula, in the time domain:

$$\overline{X}_{mes} = \sum_{k=0}^{N-1} [x(k \cdot \Delta T)](a_k + jb_k) \quad (1)$$

Figure 1:
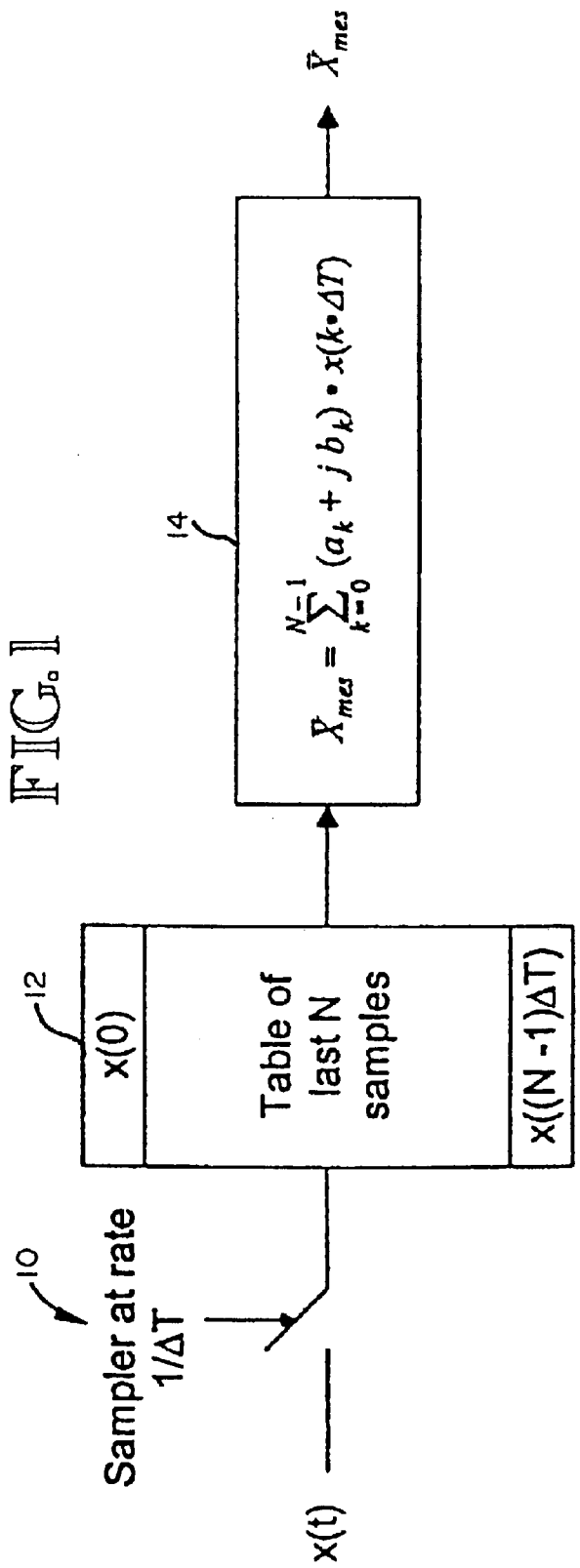
FIG. 1 shows the diagram of a phasor filtering system represented in the time domain.

This is implemented by the system shown in FIG. 1, which includes a sampling circuit 10 operating at a selected rate $(1/\Delta T)$ on a waveform, such as a voltage or current waveform. The samples (the last N number thereof) are stored in a table 12 and then operated on by calculation circuit 14 with equation (1) to produce a resulting phasor, referred to as a measured phasor. This is conventional. The same equation can be expressed in the z domain, which is commonly used to express digital filter operation:

$$\overline{X}_{mes} = \sum_{k=0}^{N-1} [x((N-1-k) \cdot \Delta T)](a_{N-1-k} + j b_{N-1-k}) z^{-k} \quad (2)$$

Figure 2:
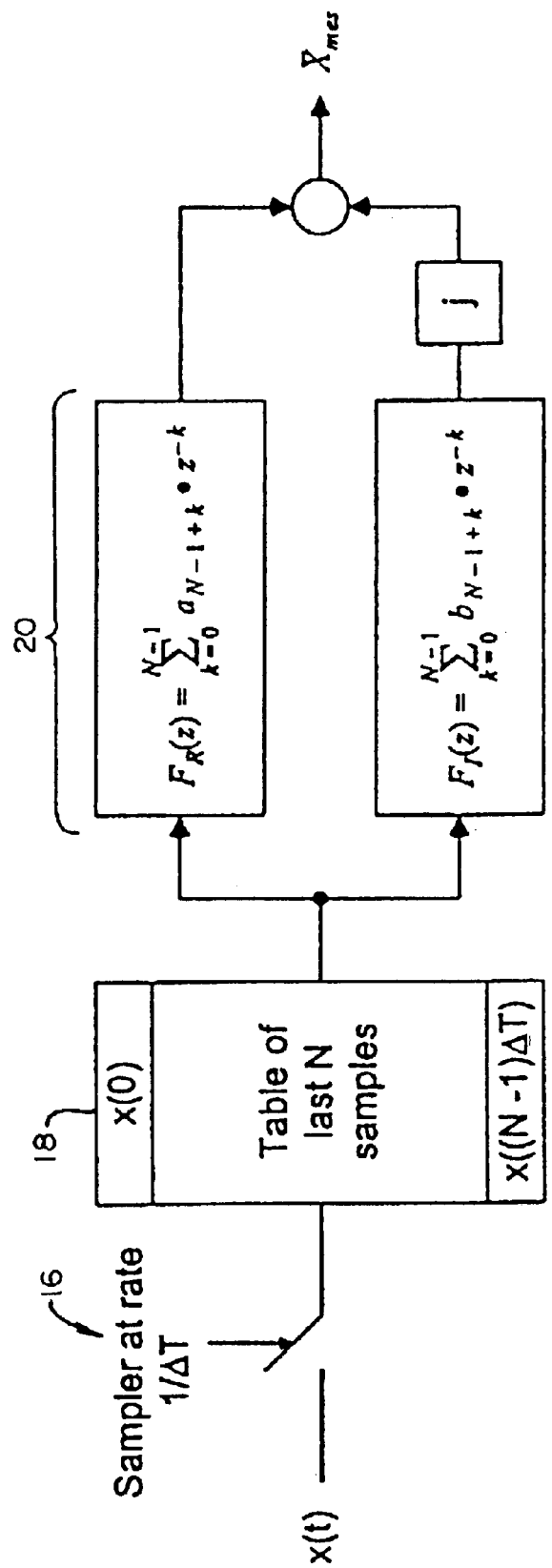
FIG. 2 represents a phasor filtering system represented in the z domain.

This is implemented by the system of FIG. 2, which includes a sampling circuit 16 and a resulting table of stored values 18 (the last N samples), which are then operated on by calculation circuit 20, using equation (2), to produce a measured phasor in the z domain. This is also conventional.

The frequency difference between the rated frequency and an actual frequency of a power system is referred to herein as $\Delta\omega$. A waveform with a $\Delta\omega$ can be defined as follows:

$$x(t) = A \cos[(\omega_0 + \Delta\omega)t + \varphi] \quad (3)$$

The exact (compensated) phasor of x(t) is provided by the complex number:

$$\overline{X} = A\, e^{j\varphi} \quad (4)$$

where $\overline{X}$ is the true or exact phasor having a magnitude A which is the maximum value of the true waveform and a phase angle which is the constant term in the instantaneous expression:

$$(\omega_0 + \Delta\omega)t + \varphi \quad (5)$$

If equation (3) is expressed in exponential form:

$$x(t) = A\left[\frac{e^{j[(\omega_0+\Delta w)t+\varphi]} + e^{-j[(\omega_0+\Delta\omega)t+\varphi]}}{2}\right] \quad (6)$$

then the measured phasor is equal to:

$$\overline{X}\,mes = \sum_{k=0}^{N-1} A\,\frac{e^{j[(\omega_0+\Delta w)k\Delta t+\varphi]} + e^{-j[(\omega_0+\Delta\omega)k\Delta t+\varphi]}}{2}(a_k + j\, b_k) \quad (7)$$

Equation (7) can further be expressed as follows, considering equation (4):

$$\overline{X}\,mes = \overline{X}\sum_{k=0}^{N-1} \frac{e^{j[(\omega_0+\Delta w)k\Delta t]}}{2}(a_k + j\, b_k) + \overline{X}*\sum_{k=0}^{N-1} \frac{e^{-j[(\omega_0+\Delta w)k\Delta t]}}{2}(a_k + j\, b_k) \quad (8)$$

The measured phasor can then be expressed as a function of the exact phasor, with two correction factors designated P and Q:

$$\overline{X}mes = P\overline{X} + Q\overline{X}* \quad (9)$$

Correction factors P and Q are functions of the frequency difference (deviation) $\Delta\omega$ in terms of the waveform and are defined as follows:

$$P(\Delta\omega) = \frac{1}{2}\sum_{k=0}^{N-1} e^{j(\omega_0+\Delta\omega)k\Delta T}(a_k + j\, b_k) \quad (10)$$

$$Q(\Delta\omega) = \frac{1}{2}\sum_{k=0}^{N-1} e^{-j(\omega_0+\Delta\omega)k\Delta T}(a_k + j\, b_k) \quad (11)$$

For a particular frequency difference $\Delta\omega$, P and Q are constant complex numbers, the value of which depends upon the sampling frequency, which is equal to $1/\Delta T$ and the (a) and (b) coefficients of the two FIR filters, referred to as $a_k$ and $b_k$. The $a_k$ and $b_k$ coefficients are constant real numbers and are associated with the type of filter used.

If the correction factors P and Q are set forth with real and imaginary parts, then $P = P_R + jP_I$ and $Q = Q_R + jQ_I$ and $X_{mes} = X_{mes\_R} + jX_{mes\_I}$ and $X = X_R + jX_I$, it is then possible to express the Cartesian components of the measured phasor ($X_{mes}$, real and imaginary parts) in terms of the exact phasor (X, real and imaginary) as follows:

$$\begin{bmatrix} X_{mes\_R} \\ X_{mes\_I} \end{bmatrix} = \begin{bmatrix} (P_R + Q_R) & (Q_I - P_I) \\ (P_I + Q_I) & (P_R - Q_R) \end{bmatrix} \cdot \begin{bmatrix} X_R \\ X_I \end{bmatrix} \quad (12)$$

The exact (or true) phasor components then can be expressed as a linear transformation of the measured phasor components after the inverse 2 by 2 matrix has been calculated, as follows:

$$\begin{bmatrix} X_R \\ X_I \end{bmatrix} = \begin{bmatrix} (P_R + Q_R) & (Q_I - P_I) \\ (P_I + Q_I) & (P_R - Q_R) \end{bmatrix}^{-1} \cdot \begin{bmatrix} X_{mes\_R} \\ X_{mes\_I} \end{bmatrix} \quad (13)$$

or:

$$\begin{bmatrix} X_R \\ X_I \end{bmatrix} = \begin{bmatrix} A(\Delta\omega) & B(\Delta\omega) \\ C(\Delta\omega) & D(\Delta\omega) \end{bmatrix} \cdot \begin{bmatrix} X_{mes\_R} \\ X_{mes\_I} \end{bmatrix} \quad (14)$$

with:

$$\begin{bmatrix} A(\Delta\omega) & B(\Delta\omega) \\ C(\Delta\omega) & D(\Delta\omega) \end{bmatrix} = \begin{bmatrix} (P_R + Q_R) & (Q_I - P_I) \\ (P_I + Q_I) & (P_R - Q_R) \end{bmatrix}^{-1} \quad (15)$$

Equation 14 (and FIG. 3) expresses the system of the present invention as follows: if the phasor of a sine wave such as voltage or current is measured using a pair of FIR filters, each of an order N, at a frequency which is different than the rated frequency, the exact (true) phasor can then be determined by applying a linear transformation to the Cartesian coordinates of the measured phasor. The linear transformation is accomplished by a correction matrix which is defined by equation (15). The four real numbers A, B, C, D in the correction matrix are readily available for a given frequency difference by computing the value of P and Q with equations (10) and (11) and then by taking the inverse of the matrix as equation (15). The result is an exact phasor, without any error, regardless of the difference in frequency between the system actual frequency (at any point in time) and the rated frequency, respectively, of the power system.

As discussed above, an accurate determination of the P and Q correction factors requires the determination of the actual frequency of the incoming signal. This can be done with a variety of techniques. Some examples are set forth in the article entitled "*A New Measurement Technique for Tracking Voltage Phasors, Local System Frequency and Rate of Change of Frequency*" by G. Phadke, J. S. Thorp, M. G. Adamiak, in IEEE Transactions on Power Apparatus and Systems, Vol. PAS-102, No. 5, May 1983, the contents of which are hereby incorporated by reference. Again, various known frequency measurement techniques can be used to determine the actual frequency of the power system.

Figure 3:
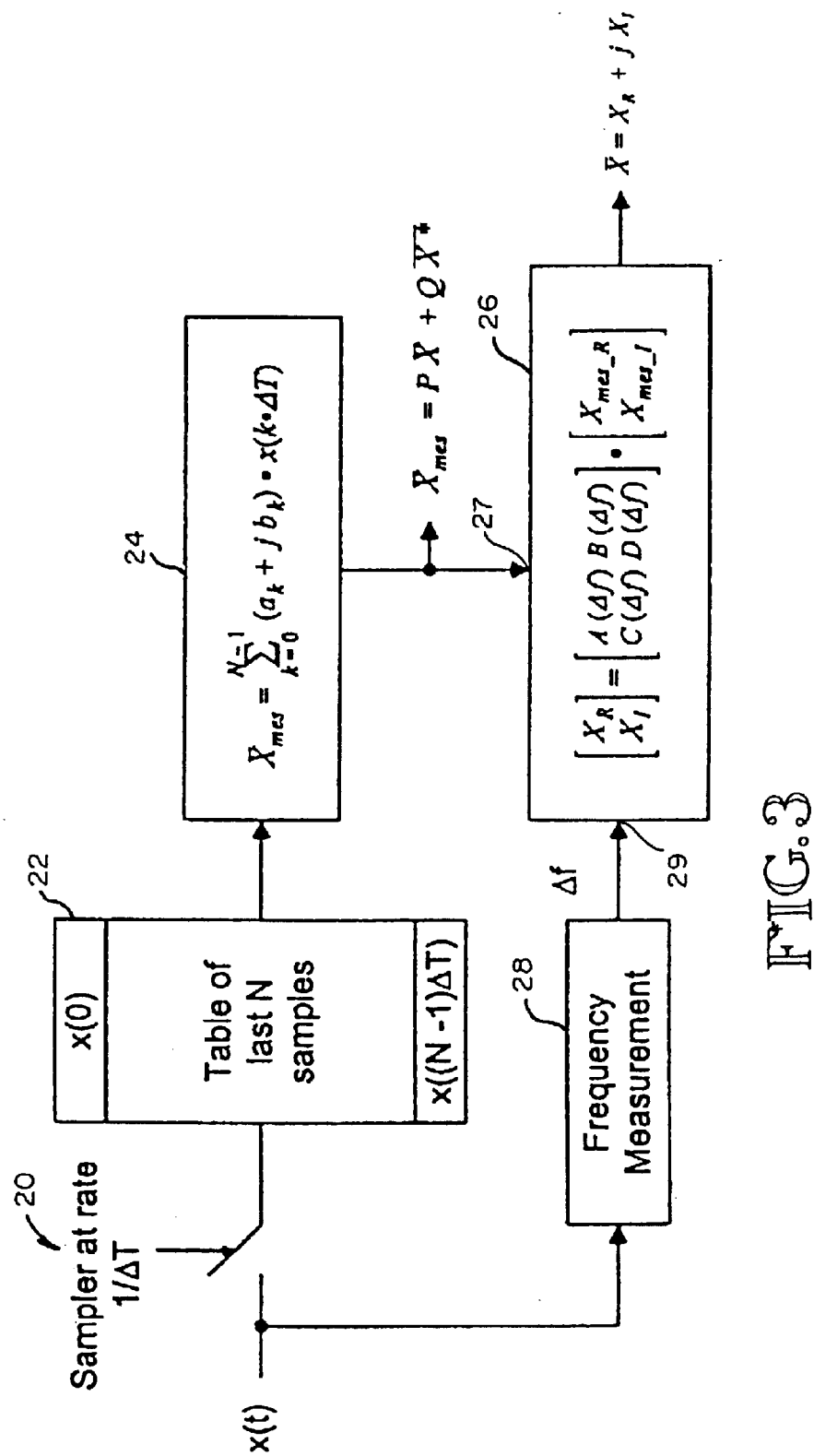
FIG. 3 is a diagram illustrating the principle of frequency compensation of the present invention.
Figure 5:
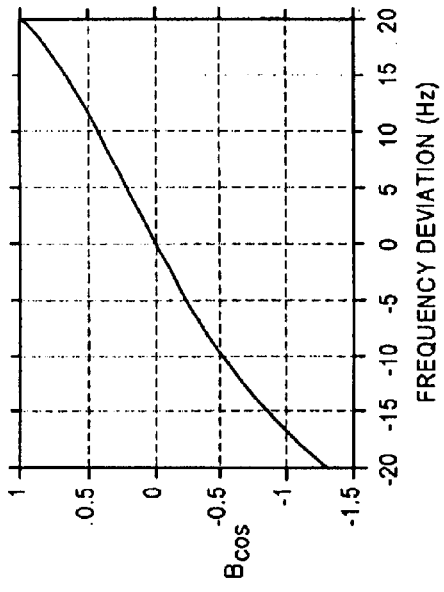
FIGS. 4–7 are plots of compensation factors for the full-cycle Cosine filter over a selected frequency range.
Figure 7:
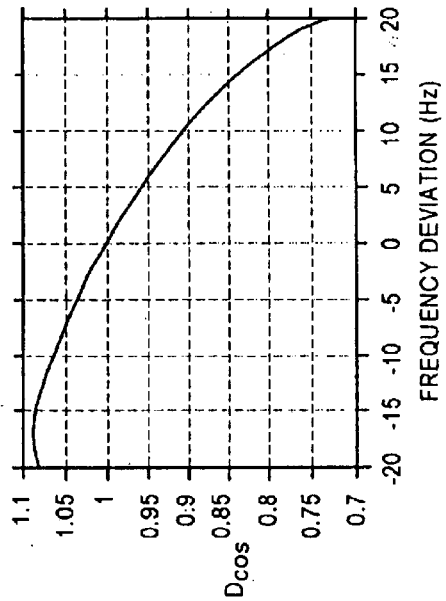
Figure 4:
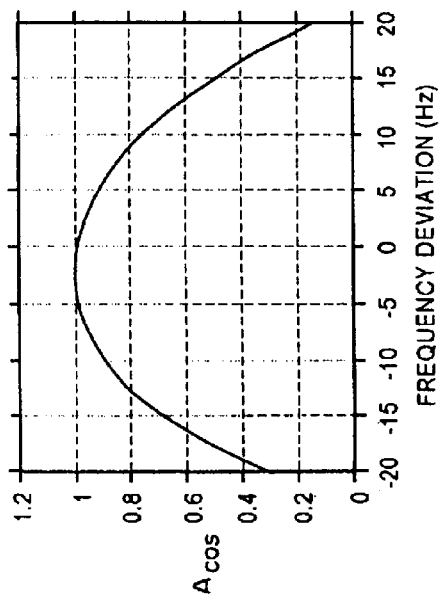
Figure 6:
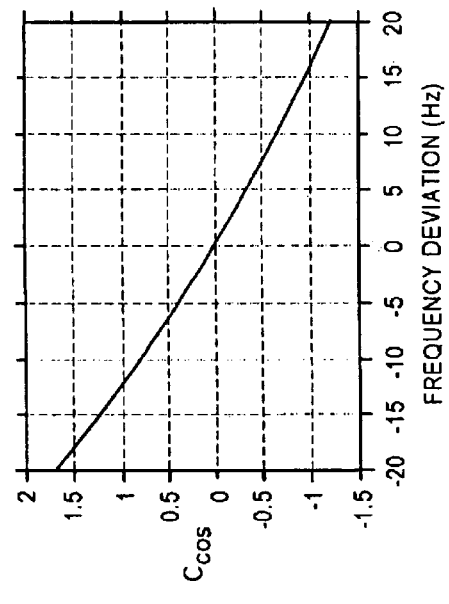

The system of the present invention is shown generally in FIG. 3. The incoming signal x(t) is sampled at 20 at a rate of 1/ΔT and a table 22 of the last N samples is stored. The stored samples are then operated on by equation (1) at 24 and applied at one input 27 to calculation circuit 26. The actual frequency of the incoming signal X(t) is determined at 28 and the difference frequency is applied to input 29 of calculation circuit 26, to determine the exact phasor, which is then used by a protective relay, for instance, in its protection function.

The above compensation is a generalized compensation approach, i.e. it can be used with a variety of FIR filter pairs.

In a first specific example, for a full cycle digital Fourier transform filter pair, the coefficients of the FIR filters are provided by the following formula:

$$a_k + j b_k = \frac{2}{N} e^{-j\frac{2\pi k}{N}} = \frac{2}{N}\left(\cos\frac{2\pi k}{N} - j\sin\frac{2\pi k}{N}\right) \quad (16)$$

$$k = 0, 1, \ldots N-1$$

The measured phase for a sine wave such as the voltage and current waveform is provided by the following formula:

$$\overline{X}_{mes} = \frac{2}{N} \sum_{k=0}^{N-1} [x(k\Delta T)] e^{-j\frac{2\pi k}{N}} \quad (17)$$

If equations (5) and (6) are then used to compute the corresponding correction factors, shown below as $P_{DFT}$ and $Q_{DFT}$, the following results:

$$P_{DFT} = P_{DFT\_R} + jP_{DFT\_I} = \frac{1}{N} \frac{\sin N\theta_1}{\sin\theta_1} e^{j(N-1)\theta_1} \quad (18)$$

and:

$$Q_{DFT} = Q_{DFT\_R} + jQ_{DFT\_I} = \frac{1}{N} \frac{\sin N\theta_2}{\sin\theta_2} e^{-j(N-1)\theta_2} \quad (19)$$

$\theta_1$ and $\theta_2$ are determined by the following calculations:

$$\theta_1 = \frac{\Delta\omega\Delta T}{2} \quad (20)$$

$$\theta_2 = \frac{\Delta\omega\Delta T + \frac{4\pi}{N}}{2} \quad (21)$$

A second example is for a half-cycle digital Fourier transform (DFT) filter pair which have data windows which are one-half of the full cycle DFT. The coefficients of the corresponding FIR filters are:

$$a_k + jb_k = \frac{4}{N} e^{-j\frac{2\pi k}{N}} \quad (22)$$

$$k = 0, 1, \ldots N/2 - 1$$

with the measured phasor being provided by the following equation:

$$X_{mes} = \frac{4}{N} \sum_{k=0}^{N/2-1} [x(k\Delta T)] e^{-j\frac{2\pi k}{N}} \quad (23)$$

The two correction factors P and Q relative to the half-cycle DFT filter indicated by $P_{HDFT}$ and $Q_{HDPT}$ are then also calculated using equations (5) and (6).

$$P_{HDFT} = \frac{2}{N} \frac{\sin\frac{N}{2}\theta_1}{\sin\theta_1} e^{j\left(\frac{N}{2}-1\right)\theta_1} \quad (24)$$

$$Q_{HDFT} = \frac{2}{N} \frac{\sin\frac{N}{2}\theta_2}{\sin\theta_2} e^{-j\left(\frac{N}{2}-1\right)\theta_2} \quad (25)$$

where $\theta_1$ and $\theta_2$ are defined as in equations (20) and (21).

In a third example, for a full cycle Cosine filter pair, the measured phasor is provided by the following equation:

$$\overline{X}_{mes} = \frac{2}{N}\sum_{k=0}^{N-1} x(k\Delta T) - jx\left(\left(k + \frac{N}{4}\right)\Delta T\right)\cos\frac{2\pi k}{N} \quad (26)$$

The two correction factors P and Q for the full cycle Cosine filter, $P_{cos}$ and $Q_{cos}$, are also determined from equations (20) and (21):

$$P_{COS} = \frac{1}{2N}\left[1 - je^{j\frac{N}{4}(\omega_0 + \Delta\omega)\Delta T}\right] \cdot \left[\frac{\sin N\theta_1}{\sin\theta_1}e^{j(N-1)\theta_1}\right] \cdot \quad (27)$$
$$\left[\frac{\sin N\theta_2}{\sin\theta_2}e^{j(N-1)\theta_2}\right]$$

$$Q_{COS} = \frac{1}{2N}\left[1 - je^{-j\frac{N}{4}(\omega_0 + \Delta\omega)\Delta T}\right] \cdot \left[\frac{\sin N\theta_1}{\sin\theta_1}e^{-j(N-1)\theta_1}\right] \cdot \quad (28)$$
$$\left[\frac{\sin N\theta_2}{\sin\theta_2}e^{-j(N-1)\theta_2}\right]$$

Hence, after a particular filter arrangement has been selected, the filter coefficients for those filters are determined and then the P and Q correction factors, for a particular frequency difference between the rated frequency and the actual frequency. The four numbers A, B, C, D of the compensating matrix can thereafter be determined to produce the exact phasor.

With the above process, the numbers can be precalculated for several frequency differences (Δf) and then plotted to cover a predetermined range of frequency differences. FIGS. 4–7 represent the plots of the four numbers (elements) A, B, C, D, respectively, of the matrix for a full-cycle Cosine filter, covering a frequency range (for the actual frequency) of 40–80 Hz (−20 Hz to +20 Hz), where the number of samples per cycle (N) of the filter system is 16 and the system sampling frequency is 960 Hz.

Figure 8:
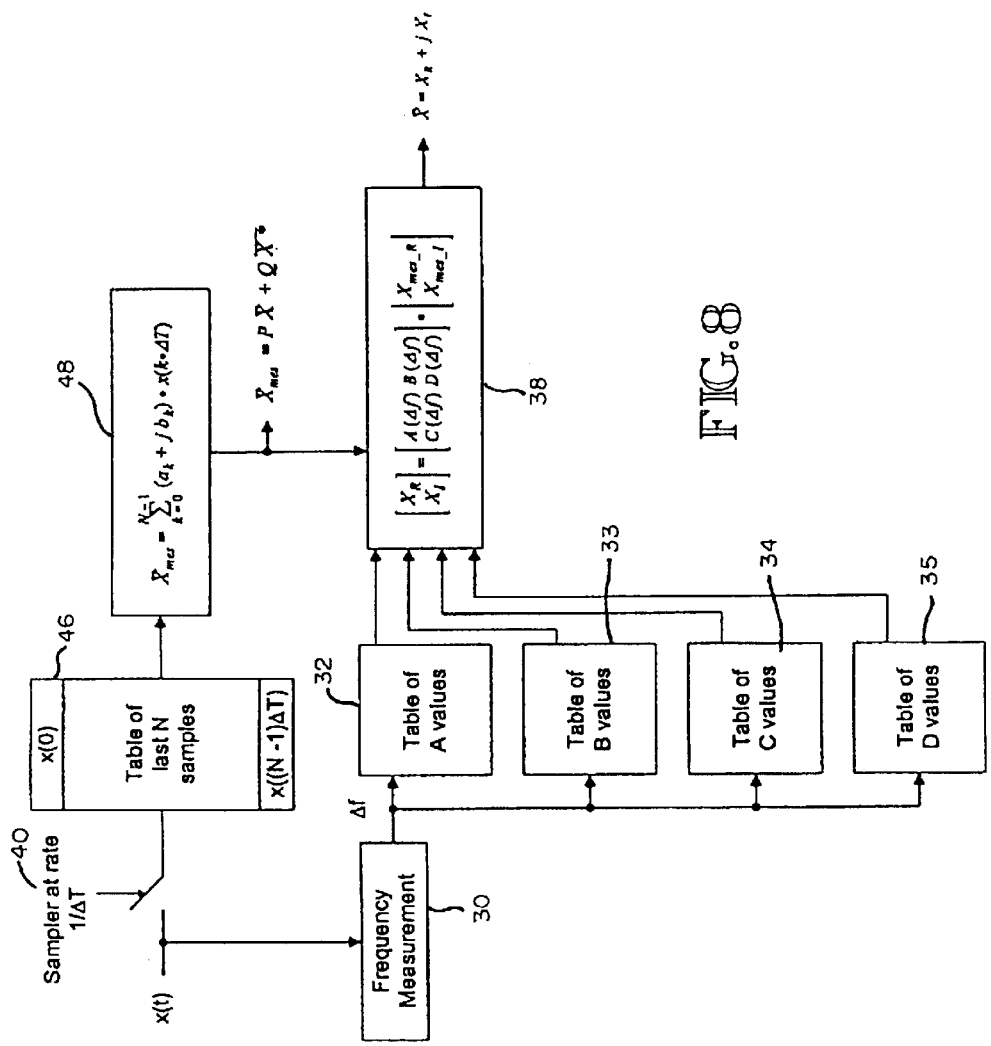
FIG. 8 is a diagram showing the compensation system of the present invention using stored four compensating matrix elements.

The four element values of several selected frequencies can be stored in a table, with the element values for a particular value of frequency difference Δf between the various table values being determined by interpolation. The correct A, B, C and D values can be quickly provided once a Δf is determined. This saves the calculation of those values each time an exact phasor is calculated. This is shown in the system of FIG. 8, where an actual frequency measurement is made at 30, and where the A, B, C, D element values for a range of Δf are stored in Tables 32–35. The selected element values are directed to a calculation circuit 38, which carries out the calculation discussed above on the measured phasor $X_{mes}$ to produce an exact phasor X. The measured phasor is determined like FIG. 1, with a sampling process 40, a table of sampled values 46 and a calculation circuit 48. The output of calculated circuit 48 is applied to calculation circuit 38. The output of calculation circuit 38 is the exact phasor, having a real component $X_R$ and an imaginary component $jX_I$.

Alternatively, the four element values A, B, C, D can be represented by a polynomial of order m, where m is typically equal to 3 or higher. Polynomial regression analysis represents the compensation matrix elements as follows:

$$A = a_4\Delta f^4 + a_3\Delta f^3 + a_2\Delta f^2 + a_1\Delta f^1 + a_0\Delta f^0 \quad (29)$$
$$B = b_4\Delta f^4 + b_3\Delta f^3 + b_2\Delta f^2 + b_1\Delta f^1 + b_0\Delta f^0 \quad (30)$$
$$C = c_4\Delta f^4 + c_3\Delta f^3 + c_2\Delta f^2 + c_1\Delta f^1 + c_0\Delta f^0 \quad (31)$$
$$D = d_4\Delta f^4 + d_3\Delta f^3 + d_2\Delta f^2 + d_1\Delta f^1 + d_0\Delta f^0 \quad (32)$$

The system for determining an exact phasor from a measured phasor at a particular difference frequency is shown in FIG. 9. The frequency difference Δf, as determined by element 50 in FIG. 9, is applied to tables 54–57 in which are stored the polynomial coefficients for the particular filter pair used. The compensating matrix elements A, B, C, D are then calculated using the stored coefficients and the above equations 29–32. The four compensating element values are applied as inputs to calculation circuit 58, along with the measured phasor $X_{mes}$. The output of circuit 58 is the exact (true) phasor, comprising a real component $X_R$ and an imaginary component $jX_I$.

The above system and method results in an exact phasor value using a measured phasor and the frequency difference between the actual frequency and the rated frequency of the power system. The system provides accurate results over a range of frequency difference (Δf). When more than one exact waveform phasor is to be determined, in a given system with a known Δf, it is necessary to compute the compensating element only once. The same values can be used for all measured phasors in the system.

Although a preferred embodiment of the invention has been described for purposes of illustration, it should be understood that various changes, modification and substitutions may be incorporated in the embodiment without departing from the spirit of the invention which is defined in the claims which follow.

What is claimed:

1. A system for determining an accurate fundamental phasor for a signal waveform of a power system when a difference exists between a rated frequency and an actual frequency of the signal waveform, the system comprising:

a first circuit for determining a measured phasor representing the signal waveform, the measured phasor including a real part and an imaginary part;

a second circuit for determining the actual frequency of the signal waveform and the frequency difference between the actual frequency and the rated frequency of the signal waveform;

a third circuit for determining a plurality of correction factors associated with the frequency difference, each of the plurality of correction factors having a real part and an imaginary part; and a fourth circuit for determining the accurate fundamental phasor including a real part and an imaginary part, the fourth circuit multiplying the real and imaginary parts of the measured phasor by a 2 by 2 compensating matrix, the 2 by 2 matrix including elements with values that are all non-zero, the elements including the plurality of correction factors.

2. The system of claim 1, wherein each of the elements of a first diagonal of the 2 by 2 compensating matrix correspond to an inverse of respective different functions of the real parts of the plurality of correction factors, and wherein each of the elements of a second diagonal of the 2 by 2 compensating matrix correspond to an inverse of a respective different function of the imaginary parts of the plurality of correction factors.

3. The system of claim 1, wherein the signal waveform is one of a voltage waveform and a current waveform, and wherein the accurate fundamental phasors are used by a protective relay for monitoring the power system.

4. The system of claim 1, wherein the 2 by 2 compensating matrix is used for a linear transformation of the Cartesian coordinates of the measured phasor to form the accurate fundamental phasor.

5. The system of claim 1, wherein the 2 by 2 compensating matrix is defined by the following expression:

$$\begin{bmatrix} X_R \\ X_I \end{bmatrix} = \begin{bmatrix} A(\Delta\omega) & B(\Delta\omega) \\ C(\Delta\omega) & D(\Delta\omega) \end{bmatrix} \cdot \begin{bmatrix} X_{\text{mes\_R}} \\ X_{\text{mes\_I}} \end{bmatrix}$$

wherein the first circuit includes a pair of orthogonal finite impulse response (FIR) filters, wherein $X_R$ and $X_I$ respectively equal the real and imaginary parts of the accurate fundamental phasor, wherein $X_{\text{mes\_R}}$ and $X_{\text{mes\_I}}$ respectively equal the real and imaginary parts of the measured phasor, wherein $\Delta\omega$ is the frequency difference, and wherein the A, B, C, D values correspond to the elements of the 2 by 2 compensating matrix and depend upon at least one characteristic of the pair of orthogonal FIR filters.

6. The system of claim 1, wherein the first circuit is selected from the group consisting of a full cycle Fourier filter pair, a half cycle Fourier filter pair, a full cycle Cosine filter pair and a half cycle Cosine filter pair.

7. A method for determining an accurate fundamental phasor for a signal waveform of a power system when a difference exists between a rated frequency and an actual frequency of the signal waveform, the method comprising:

determining a measured phasor, representing the signal waveform, the measured phasor including a real part and an imaginary part;

determining the actual frequency of the signal waveform and the frequency difference between the actual frequency and the rated frequency of the signal waveform;

determining a plurality of correction factors associated with the frequency difference, each of the plurality of correction factors having a real part and an imaginary part; and determining the accurate fundamental phasor, including a real part and an imaginary part by multiplying the real and imaginary parts of the measured phasor by 2 by 2 compensating matrix, the 2 by 2 compensating matrix including elements with values that are all non-zero, the elements including the plurality of correction factors.

8. The method of claim 7, wherein the 2 by 2 compensating matrix is defined by the following expression:

$$\begin{bmatrix} X_R \\ X_I \end{bmatrix} = \begin{bmatrix} A(\Delta\omega) & B(\Delta\omega) \\ C(\Delta\omega) & D(\Delta\omega) \end{bmatrix} \cdot \begin{bmatrix} X_{\text{mes\_R}} \\ X_{\text{mes\_I}} \end{bmatrix}$$

wherein determining the measured phasor includes determining the measured phasor using a pair of orthogonal finite impulse response (FIR) filters, wherein $X_R$ and $X_I$ respectively equal the real and imaginary parts of the exact fundamental accurate phasor, wherein $X_{\text{mes\_R}}$ and $X_{\text{mes\_I}}$ respectively equal the real and imaginary parts of the measured phasor, wherein $\Delta\omega$ is the frequency difference, and wherein the A, B, C, D values correspond to the elements of the 2 by 2 compensating matrix and depend upon at least one characteristic of the pair of orthogonal FIR filters.

9. The method of claim 8, wherein the pair of FIR filters are selected from the group consisting of a full cycle Fourier filter pair, a half cycle Fourier filter pair, a full cycle Cosine filter pair and a half cycle Cosine filter pair.

10. The method of claim 7, wherein each of the elements of a first diagonal of the 2 by 2 compensating matrix correspond to an inverse of respective different functions of the real parts of the plurality of correction factors, and wherein each of the elements of a second diagonal of the 2 by 2 compensating matrix correspond to an inverse of a respective different function of the imaginary parts of the plurality of correction factors.

11. The method of claim 7, wherein signal waveform is one of a voltage waveform and a current waveform, and wherein the accurate fundamental phasors are used by a protective relay for monitoring the power system.

12. The method of claim 7, wherein the 2 by 2 compensating matrix is used for a linear transformation of the Cartesian coordinates of the measured phasor to form the accurate fundamental phasor.

13. A system for determining an accurate fundamental phasor for a signal waveform of a power system when a difference exists between a rated frequency and an actual frequency of the signal waveform, the system comprising:

a pair of orthogonal finite impulse response filters adapted to determine a measured phasor representing the signal waveform, the measured phasor including a real part and an imaginary part, each of the pair of orthogonal finite impulse response filters having an associated filter-specific coefficient;

a first circuit for determining the actual frequency of the signal waveform and the frequency difference between the actual frequency and the rated frequency of the signal waveform;

a second circuit for determining a plurality of correction factors based on the frequency difference and the filter-specific coefficients, each of the plurality of correction factors having a real part and an imaginary part; and a third circuit for determining the accurate fundamental phasor including a real part and an imaginary part, the third circuit multiplying the real and imaginary parts of the measured phasor by a 2 by 2 compensating matrix, the 2 by 2 compensating matrix including four elements with values that are all non-zero, the elements including the plurality of correction factors.

14. The system of claim 13, wherein two of the four elements of a first diagonal of the 2 by 2 compensating matrix correspond to an inverse of respective different functions of the real parts of the plurality of correction factors, and wherein two of the four elements of a second diagonal of the 2 by 2 compensating matrix correspond to an inverse of a respective different function of the imaginary parts of the plurality of correction factors.

15. The system of claim 13, wherein the signal waveform is one of a voltage waveform and a current waveform and wherein the accurate fundamental phasors are used by a protective relay for monitoring the power system.

16. The system of claim 13, wherein the 2 by 2 compensating matrix is used for a linear transformation of the Cartesian coordinates of the measured phasor to form the accurate fundamental phasor.

17. The system of claim 13, wherein the 2 by 2 compensating matrix is defined by the following expression:

$$\begin{bmatrix} X_R \\ X_I \end{bmatrix} = \begin{bmatrix} A(\Delta\omega) & B(\Delta\omega) \\ C(\Delta\omega) & D(\Delta\omega) \end{bmatrix} \cdot \begin{bmatrix} X_{\text{mes\_R}} \\ X_{\text{mes\_I}} \end{bmatrix}$$

wherein $X_R$ and $X_I$ respectively equal the real and imaginary parts of the accurate fundamental phasor, wherein $X_{\text{mes\_R}}$ and $X_{\text{mes\_I}}$ respectively equal the real and imaginary parts of the measured phasor, wherein $\Delta\omega$ is the frequency difference, and wherein the A, B, C, D values correspond to the four elements of the 2 by 2 compensating matrix.

18. The system of claim 13, wherein the pair of orthogonal finite impulse response filters are selected from the group consisting of a full cycle Fourier filter pair, a half cycle Fourier filter pair, a full cycle Cosine filter pair and a half cycle Cosine filter pair.

19. The system of claim 13, wherein each of the orthogonal finite impulse response filters further includes a data window corresponding to a selected number of samples of the signal waveform, and wherein the filter-specific coefficients are partially based on the selected number-of samples.

* * * * *